(12) United States Patent
Sager et al.

(10) Patent No.: US 7,535,019 B1
(45) Date of Patent: May 19, 2009

(54) OPTOELECTRONIC FIBER

(75) Inventors: Brian M. Sager, Palo Alto, CA (US);
Martin R. Roscheisen, San Francisco, CA (US)

(73) Assignee: Nanosolar, Inc., Palo Alto, CA (US)

( * ) Notice: Subject to any disclaimer, the term of this patent is extended or adjusted under 35 U.S.C. 154(b) by 117 days.

(21) Appl. No.: 10/369,338

(22) Filed: Feb. 18, 2003

(51) Int. Cl.
*H01L 31/0336* (2006.01)
*H01L 31/042* (2006.01)

(52) U.S. Cl. .................... 257/43; 257/40; 257/466; 257/443; 257/E31.027; 257/E51.027; 257/E31.007; 136/263; 136/252

(58) Field of Classification Search .............. 257/40, 257/443, 466, 43; 136/252, 263
See application file for complete search history.

(56) References Cited

U.S. PATENT DOCUMENTS

| | | | |
|---|---|---|---|
| 1,975,504 A | 10/1934 | Formhals | ............... 18/8 |
| 2,984,775 A | 5/1961 | Matlow et al. | |
| 3,005,862 A | 10/1961 | Escoffery | |
| 3,046,324 A | 7/1962 | Matlow | |
| 3,976,508 A | 8/1976 | Mlavsky | |
| 3,990,914 A | 11/1976 | Weinstein et al. | |
| 4,078,944 A | 3/1978 | Mlavsky | |
| 4,113,531 A | 9/1978 | Zanio et al. | |
| 4,217,148 A | 8/1980 | Carlson | |
| 4,292,092 A | 9/1981 | Hanak | |
| 4,497,974 A | 2/1985 | Deckman et al. | |
| 4,686,323 A | 8/1987 | Biter et al. | |
| 4,783,373 A | 11/1988 | Baumeister | |
| 4,913,744 A | 4/1990 | Hoegl et al. | |
| 5,437,736 A * | 8/1995 | Cole | ............... 136/259 |
| 5,902,416 A | 5/1999 | Kem et al. | |
| 6,018,123 A | 1/2000 | Takada et al. | |
| 6,099,907 A | 8/2000 | Mattes | ............... 427/336 |

(Continued)

FOREIGN PATENT DOCUMENTS

DE   32 09 548   3/1982

(Continued)

OTHER PUBLICATIONS

Mattes,B.R, Elecrically conductive Polyaniline Fibers Prepared by dry-wet spinning Techniques, (From *Conductive Polymers and Plastics in Industrial Applications*, Society of Plastics Engineers, Plastics Design Laboratory, pp. 135-141.

(Continued)

*Primary Examiner*—Jerome Jackson, Jr.
(74) *Attorney, Agent, or Firm*—Joshua D. Isenberg; JDI Patent (57) ABSTRACT

An optoelectronic fiber and methods for forming such a fiber are disclosed. The fiber generally includes an electrically conductive fiber core, a first semiconducting layer substantially surrounding the fiber core, and a second semiconducting layer substantially surrounding the first semiconducting layer. The first and second semiconducting layers are of complementary types, i.e., one is p-type and the other is n-type. The fiber may be made, e.g., by electrospinning a material to form a fiber core; substantially surrounding the fiber with a first semiconducting material; and substantially surrounding the first semiconducting material with a second semiconducting material. Optoelectronic fibers can be fashioned into a web to provide a solar cell material or substantially transparent conductive material.

51 Claims, 6 Drawing Sheets

U.S. PATENT DOCUMENTS

| | | | |
|---|---|---|---|
| 6,107,564 | A | 8/2000 | Aguilera et al. |
| 6,258,620 | B1 | 7/2001 | Morel et al. |
| 6,270,846 | B1 | 8/2001 | Brinker ............... 427/385.5 |
| 6,294,723 | B2 | 9/2001 | Uematsu et al. |
| 6,355,873 | B1 | 3/2002 | Ishikawa |
| 6,359,210 | B2 | 3/2002 | Ho et al. |
| 6,410,843 | B1 | 6/2002 | Kishi et al. |
| 6,437,422 | B1 * | 8/2002 | Solomon et al. ............ 257/618 |
| 6,472,594 | B1 | 10/2002 | Ichinose et al. ............ 136/256 |
| 6,541,695 | B1 | 4/2003 | Mowles |
| 6,548,751 | B2 | 4/2003 | Sverdrup, Jr. et al. |
| 6,555,739 | B2 | 4/2003 | Kawam |
| 6,706,959 | B2 | 3/2004 | Hamakawa et al. |
| 6,706,963 | B2 | 3/2004 | Gaudiana et al. |
| 6,762,359 | B2 | 7/2004 | Asai et al. |
| 6,806,414 | B2 | 10/2004 | Shiotsuka et al. |
| 6,913,713 | B2 * | 7/2005 | Chittibabu et al. ....... 252/501.1 |
| 2002/0130311 | A1 | 9/2002 | Lieber et al. |
| 2002/0180909 | A1 | 12/2002 | Lubart et al. |
| 2003/0121544 | A1 | 7/2003 | Hirata et al. |
| 2004/0063320 | A1 | 4/2004 | Hollars |
| 2005/0098202 | A1 | 5/2005 | Maltby, Jr. |
| 2006/0086384 | A1 | 4/2006 | Nakata |
| 2006/0185714 | A1 | 8/2006 | Nam et al. |

FOREIGN PATENT DOCUMENTS

| | | | |
|---|---|---|---|
| DE | 3801989 | | 7/1989 |
| DE | 43 39 547 | | 11/1993 |
| DE | 43 43 514 | | 12/1993 |
| DE | 44 06 760 | | 3/1994 |
| DE | 4336582 A1 * | 5/1995 | ................ 257/466 |
| DE | 197 32 876 | | 7/1997 |
| FR | 75 30980 | | 10/1975 |
| JP | S59-125670 | | 7/1984 |
| JP | S59-143377 | | 8/1984 |
| JP | S59-144177 | | 8/1984 |
| JP | 360042876 A * | 3/1985 | ................ 257/466 |
| JP | 2000-077691 | | 3/2000 |
| WO | WO 84/04425 | * | 11/1984 ................ 257/466 |
| WO | WO 02/45143 | | 6/2002 |
| WO | WO 03/049201 | | 6/2003 |
| WO | WO 2004/061417 | | 7/2004 |
| WO | WO 2004/100252 | | 11/2004 |
| WO | WO 2005/034149 | | 4/2005 |
| WO | WO 2005/071760 | | 8/2005 |
| WO | WO 2006/015430 | | 2/2006 |

OTHER PUBLICATIONS

Heeger, A.J., "Semiconducting and metallic polymers: the fourth generation of polymeric materials," Synethetic Metals 125(2002) pp. 23-42.

Brinker, C.J., Scherer, G.W., *The Physics and Chemistry of Sol-Gel Processing*, Academic Press, p. 853-p. 871.

"Hot Topics in Electrodeposition" by Andrew A. Gewirth, Panos C. Andricacos, and Jay A. Switzer, with John O. Dukovic, editor, The Electrochemical Society Interface, Spring 1998, an electronic copy of which may be accessed at http://www.electrochem.org/publications/interface/spring98/IF3-98-Pages22-25.pdf.

U.S. Appl. No. 10/290,119, to Brian M. Sager et al., filed Nov. 5, 2002 and entitled "Optoelectronic Device and Fabrication Methods".

U.S. Appl. No. 10/303,665 to Martin R. Roscheisen et al. entitled "Molding Technique for Fabrication of Optoelectronic Devices" and filed on Nov. 22, 2002.

U.S. Appl. No. 10/319,406 to Brian M. Sager et al., filed on Dec. 11, 2002 and entitled "Nano-Architected/Assembled Solar Electricity Cell".

"Electrodeposition of PbS, PbSe and PbTe thin films" by Heini Saloniemi, VTT Publications 423, Dec. 15, 2000, an electronic copy of which may be accessed at http://www.inf.vtt.fi/pdf/publications/2000/P423.pdf.

D. Zhao et al. "Triblock Copolymer Syntheses of Mesoporous Silica with Periodic 50 to 300 Angstrom Pores" Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Trasnport" Adv. Mater. 13, 113-116 (Jan. 2001).

* cited by examiner

OPTOELECTRONIC FIBER

FIELD OF THE INVENTION

This invention generally relates to photovoltaic devices and more particularly to solar cell devices formed on a fiber.

BACKGROUND OF THE INVENTION

Approximately 1000 Watts of power in the form of solar radiation strike each square meter of the Earth's surface. Means for converting this solar energy into useful electricity, often referred to as solar cells, are well known. Unfortunately, such solar cells are currently made in the form of thin sheets or panels. Such panels are typically rigid, expensive, and delicate and may degrade under prolonged exposure to the elements. This makes solar cells unattractive for large-scale energy production. It would be greatly advantageous to provide solar cells in the form of a flexible, portable, versatile, light-weight, and multifunctional material that can be used to make energy-producing electronic textiles for clothing, tent material, sail material, and energy producing fabrics that can cover a wide variety of objects of various shapes and curvatures. However, such a solar cell material requires a solar cell fiber that can be knitted, woven or otherwise formed into a flexible fabric. Unfortunately, no solar cell fiber presently exists.

Thus, there is a need in the art for a solar cell material that overcomes the above disadvantages and a corresponding need for methods and apparatus for producing such a solar cell material.

SUMMARY OF THE INVENTION

The disadvantages associated with the prior art are overcome by embodiments of the present invention directed to an optoelectronic fiber, methods and apparatus for producing such a fiber and a fabric made from such a fiber.

According to an embodiment of the invention, the fiber generally includes a fiber core, a first semiconducting layer substantially surrounding the fiber core, and a second semiconducting layer substantially surrounding the first semiconducting layer. The first and second semiconducting layers may be of complementary types, i.e., one is p-type and the other is n-type. The fiber core may be electrically conductive.

According to an alternative embodiment, the second semiconducting layer includes a nanostructured material having pores distributed in a substantially uniform manner. The pores in the nanostructured material may be distributed in a substantially uniform fashion with neighboring pores being between about 1 nm and bout 50 nm apart from each other. The second semiconducting layer may include a semiconducting material that fills the pores in the first semiconducting layer According to another embodiment of the invention, the fiber may be made by electrospinning a material to form a fiber core; substantially surrounding the fiber with a first semiconducting material; and substantially surrounding the first semiconducting material with a second semiconducting material. The first and second semiconducting layers are of complementary types. Alternatively, the fiber core may be formed by sol gel techniques, such as monolithic gel processing, conventional fiber drawing above the glass softening temperature for the gel, drawing fibers directly from viscous sols at room temperature, and unidirectional freezing of gels. Other suitable fiber-forming techniques include spinning techniques, such as dry-wet spinning.

A plurality of conductive fibers may be fashioned into a regular web, e.g., by weaving or knitting. Alternatively, one or more conductive fibers may be fashioned into a random web structure. Such webs may be useful, e.g., as a flexible solar cell material. Alternatively, such a web may serve as a flexible transparent conducting material.

Embodiments of the present invention provide new and useful optoelectronic materials that may be formed relatively inexpensively and on a large scale.

DETAILED DESCRIPTION OF THE INVENTION

Contents

I. Glossary

II. General Overview

III. Optoelectronic Fiber Architecture

IV. Fabrication of Optoelectronic Fibers

V. Alternative Embodiments

VI. Conclusion

I. GLOSSARY

The following terms are intended to have the following general meanings as they are used herein:

Electrospinning: In general, electrospinning refers to a process for forming threads or fibers from a spinning solution by passing the solution into an electric field in a thin stream or in drops on order to separate the stream or drops into threads.

Device: An assembly or sub-assembly having two or more layers of material.

Semiconductor: As used herein, semiconductor generally refers to a material characterized by an electrical conductivity that depends strongly on material properties and other factors. Material properties may include crystalline orientation and the presence of dopants. Other factors may include temperature, applied electric field, incident radiation, and the like.

N-type semiconductor, P-type semiconductor: In the case of a doped semiconductor material, an n-type semiconductor is doped with an electron donor material and a p-type semiconductor is doped with an electron donor material.

Complementary-type semiconductors: As used herein, p-type and n-type semiconductors are said to be of complementary types with respect to each other.

Surfactant Templating: In general, surfactant templating refers an approach toward achieving pore size control of inorganic frameworks. By way of example, surfactant templating may be used to prepare a high-porosity, surfactant and microemulsion templated thin film by mixing a precursor sol, a solvent, water, a surfactant, and a hydrophobic polymer.

Optoelectronic Device: A device that interacts with radiation and electric current. Such a device could be a light-emitting device, e.g. an LED or laser, or a light absorbing device, e.g. a photodetector/counter or photovoltaic cell (solar cell) or radiation-driven electrolytic cell.

Solar Cell: A photovoltaic device that interacts with radiation (often in the form of sunlight) impinging on the device to produce electric power or voltage.

Organic Solar Cell: A type of solar cell wherein an active photoelectric layer is fabricated, either partly or entirely, using organic materials comprising, e.g., polymers, dyes, pigments (including mixtures) that are predominantly carbon based compounds. These materials may be insulating, conductive or semiconductive.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Material: The term "material" is used herein to refer to solid-state compounds, extended solids, extended solutions, clusters of molecules or atoms, crystals, polymers, dyes, particularly including conjugated polymers and dyes.

Inorganic Materials: Materials which do not contain carbon as a principal element. The oxides and sulphides of carbon and the metallic carbides are considered inorganic materials. Examples of inorganic compounds which can be synthesized using the methods of the present invention include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Ceramics: Typically, a ceramic is a metal oxide, boride, carbide, nitride, or a mixture of such materials. In addition, ceramics are inorganic, nonmetallic products that are subjected to high temperatures (i.e., above visible red, 540° C. to 1000° C.) during manufacture or use. Such materials include, for example, alumina, zirconium, silicon carbide, aluminum nitride, silicon nitride, the $YBa_2Cu_3O_{7-\delta}$ superconductor, ferrite ($BaFe_{12}O_{19}$), Zeolite A ($Na_{12}$ [($SiO_2)_{12}(AlO_2)$)] $27H_2O$), soft and permanent magnets, etc. High temperature superconductors are illustrative of materials that can be formed and screened using the present invention. "High temperature superconductors" include, but are not restricted to, the $La_{2-x}Sr_xCuO_4$ superconductors, the $Bi_2CaSr_2Cu_2O_{8+x}$ superconductors, the $Ba_{1-x}K_xBiO_3$ superconductors and the ReBaCu superconductors. Such high temperature superconductors will, when they have the desired properties, have critical temperatures above 30 K., preferably above 50 K., and more preferably above 70 K, where K represents the Kelvin unit of temperature.

(e) Inorganic polymers such as polysilanes or other non-carbon based polymers or monomers.

Organic Materials: Compounds, which generally consist of carbon and hydrogen, with or without oxygen, nitrogen or other elements, except those in which carbon does not play a critical role (e.g., carbonate salts). Examples of organic materials which can be synthesized using the methods of the present invention include, but are not restricted to, the following:

(a) Non-biological, organic polymers: Nonmetallic materials consisting of large macromolecules composed of many repeating units. Such materials can be either natural or synthetic, cross-linked or non-crosslinked, and they may be homopolymers, copolymers, or higher-ordered polymers (e.g., terpolymers, etc.). By "non-biological," α-amino acids and nucleotides are excluded. More particularly, "non-biological, organic polymers" exclude those polymers which are synthesized by a linear, stepwise coupling of building blocks. Examples of polymers which can be prepared using the methods of the present invention include, but are not limited to, the following: polyurethanes, polyesters, polycarbonates, polyethyleneimines, polyacetates, polystyrenes, polyamides, polyanilines, polyacetylenes, polypyrroles, conjugate polymers, (e.g., semiconductive or conductive polymers such as polyphenylvinylene, polythiophene, polyfluorenes, polyparaphenylene and polymers containing $C_{60}$ or dyes such as perylenes or phthalocyanines) or conductive polymers such as doped PEDOT (Rayfron) or polyanyline. These may be synthesized or grafted onto one another using either classical organic chemistry techniques or using enzymes to catalyze specific reactions.

(b) Organic Dyes and pigments such as derivatives of perylenes, phthalocyanines, merocyanines, terylenes and squarines.

(c) Conjugated polymers are semiconducting polymers, e.g. having repeating units of the type:

with alternating single and double bonds. By contrast, polymers having repeating units of the type tend to be insulating polymers. Dyes may be conjugated but have no repeating units. Conjugation usually results in absorption of visible light.

Composite Materials: Any combination of two materials differing in form or composition on a macroscale. The constituents of composite materials retain their identities, i.e., they do not dissolve or merge completely into one another although they act in concert. Such composite materials may be inorganic, organic or a combination thereof. Included within this definition are, for example, doped materials, dispersed metal catalysts and other heterogeneous solids.

Nanostructured Material: As used herein "nanostructured material" generally refers to a material having features characterized by a width, or other characteristic dimension, on the order of several nanometers ($10^{-9}$ m) across.

II. GENERAL OVERVIEW

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

In embodiments of the present invention, fibers formed, e.g., by electrospinning techniques serve as a substrate for one or more optoelectronic devices formed by coating a core conducting fiber with two semiconducting layers of complementary types. According to a particular set of embodiment, at least one of the semiconducting layers may be fabricated, in part, by surfactant templating techniques. The fibers may subsequently be made into a fabric, e.g., by weaving, or the like. Alternatively, one or more conductive fibers may be compressed into a randomly arranged structure to form a fabric. Such fabrics have potentially unlimited uses. The combination of these techniques allows for the economically efficient mass production of optoelectronic devices of arbitrarily large scale in a form that is easy to store, pack, ship, and assemble.

III. OPTOELECTRONIC FIBER BASIC ARCHITECTURE

Figure 1A:
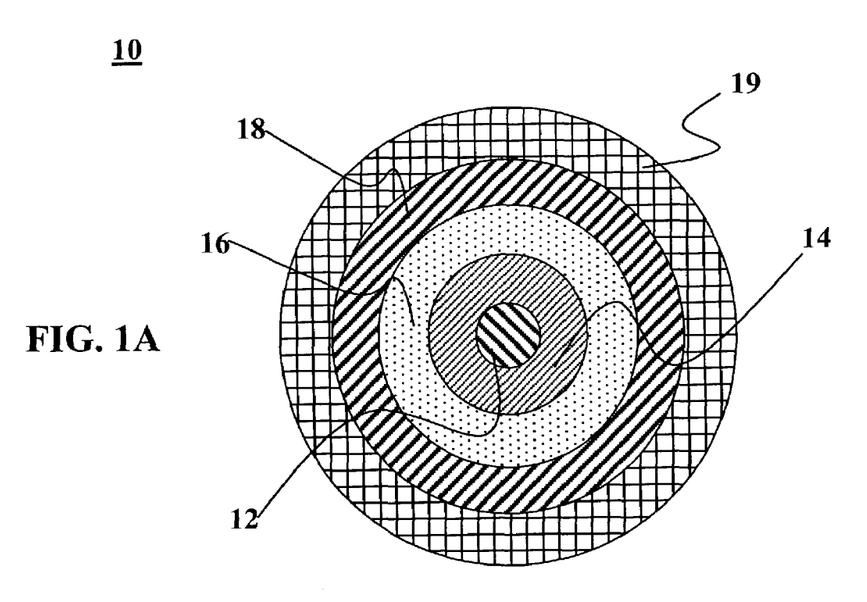
FIGS. 1A-1B respectively depict front and side cross-sectional views of a portion of an optoelectronic fiber according to an embodiment of the present invention.
Figure 1B:
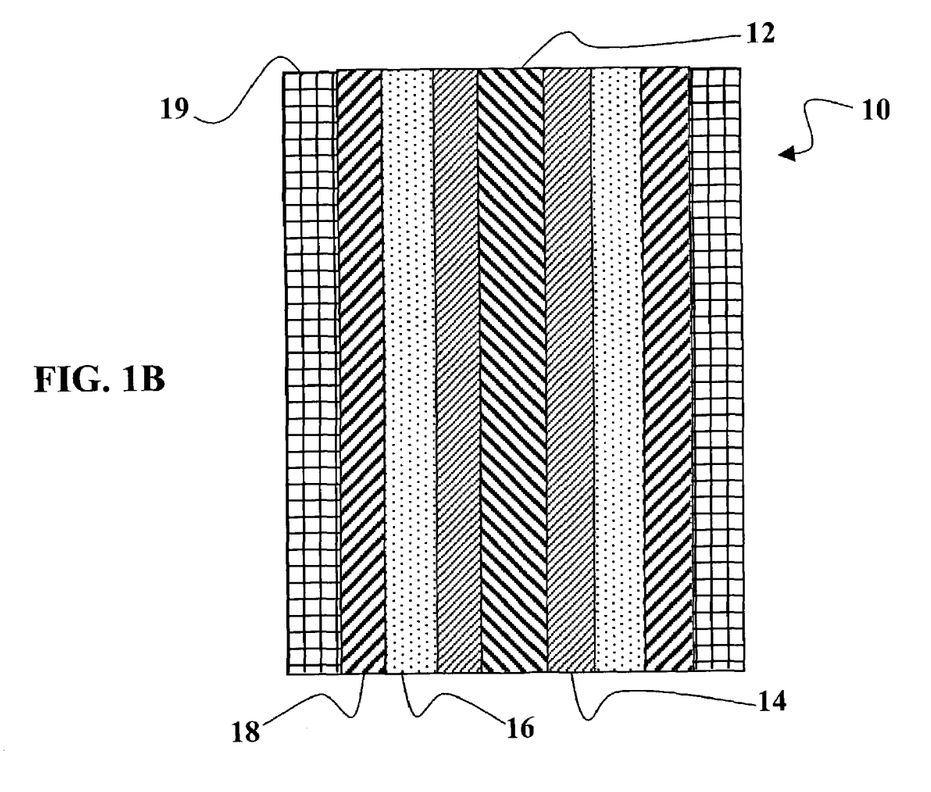

An optoelectronic fiber according to an embodiment of the present invention is depicted in FIGS. 1A-1B. The fiber 10 generally includes fiber core 12 and first and second semiconducting layers 14, 16. The first semiconducting layer 14 substantially surrounds the core 12. The second semiconducting layer 16 substantially surrounds the first semiconducting layer 14. The fiber 10 may also include a conducting layer 18 that substantially surrounds the second semiconducting layer 16. An encapsulating layer 19 may substantially surround the fiber core, semiconducting layers 14, 16, and conducting layer 18 (if any). In certain examples, the fiber core 12 may have a diameter of between about 10 nanometer (nm) and about 5 millimeters (mm). The diameter of the fiber core 12 may be between about 10 nm and about 400 nm for applications based on photonic effects and between about 400 nm and about 5 mm for applications based on classical optical effects. The fiber core 12 may be made from any suitable fiber-making material. The choice of material may depend on the particular application intended for the fiber 10. Examples of such materials include materials suitable for structural integrity and strength such as glass, carbon (graphite), PET, plastic clad silica (PCS), which has a silica glass core and a plastic cladding. Other suitable fiber core materials include materials that are often used for fiber optic applications include polymethyl methacrylate, (PMMA) modified, other polymers of methacrylic acid ethers, polystyrene and styrene copolymers with methyl methacrylate and alkyl methacrylates. Other suitable materials for the fiber core 12 include materials often used for covers of optical fibers such as fluorine containing PMMA, α-fluoro-acrylates and fluorine containing methacrylates. Although, FIG. 1B depicts the core 12 as having a substantially circular cross-section, other cross-sectional shapes, e.g., elliptical, oval, etc. may be used.

For optoelectronic applications of the fiber 10, the first and second semiconducting layers 14, 16 desirably have different electron affinities. As a result, the fiber 10 may act as an optoelectronic device. Such an optoelectronic device may be a photovoltaic device, e.g., a solar cell, or a light-emitting device, e.g., a light emitting diode or laser. In the case of a photovoltaic device, the first and/or second semiconducting materials absorb radiation such a way as to produce a voltage between the conducting fiber core 12 and the conducting layer 18. In the case of a light-emitting device, a voltage applied between the first and second semiconducting layers 14, 16, e.g., by applying a voltage between the fiber core 12 and the conducting layer 18, may cause the emission of radiation by annihilation of electron-hole pairs at the interface between the first and second semiconducting layers 14, 16. Either way, it is typically desirable that the encapsulating layer 19 be transparent to whatever radiation is to be emitted or absorbed. In some applications it may be further desirable to combine the functions of the conducting layer 18 and the encapsulating layer 19 in a single layer of material, e.g., a transparent conducing polymer.

By way of example, the first and second semiconducting layers 14, 16 may be made from polymers or small molecules which can act as electron acceptors are e.g. polymers, containing CN— or CF3 groups like CN-PPV, MEH-CN-PPV, CF3 substituted ones or Buckminsterfullerene (C60) alone or functionalized to enhance solubility. Semiconducting polymers or small molecules which do not contain such or other electron withdrawing groups can often act as hole acceptors, for instance the following polymers (and their derivatives) or copolymers containing units of the following polymers (and derivatives): poly(phenylene), poly(phenylene vinylene), poly(thiophene), poly(silane), poly(thienylene vinylene) and poly (isothianaphthene). Other suitable semiconductive materials include: organometallic polymers; phthalocyanines, perylenes, naphthalocyanines, squaraines, merocyanines and their respective derivatives; and azo-dyes consisting of azo chromofore (—N=N—) linking aromatic groups. Other suitable materials include perylene polymer, poly (squaraines) and organic molecules. Examples of semiconductive organic molecules include dyes and pigments, as described in U.S. Pat. No. 4,281,053, U.S. Pat. No. 4,164,431, U.S. Pat. No. 5,201,961 and U.S. Pat. No. 5,350,459, all of which are incorporated herein by reference. Other semiconductive materials (typically hole acceptors) are: Metal oxides such as copper oxide, zinc oxide, tin oxide, indium tin oxide or (typically electron acceptors) such as Titania and related compounds. Such metal oxides may be fabricated in a wet process using sol-gel technique to facilitate large scale production such as web coating.

Alternatively, the semiconductive layers 14, 16 may be formed from a blend of semiconductive materials including blends of polymers with polymers and blends of polymers with molecules or blends with polymers and metal oxides or any combination of polymers, molecules and metal oxides.

In one particular embodiment, among others, the materials respectively comprising first and second semiconducting layers 14, 16 may be chosen so that the fiber 10 may act as an organic solar cell.

IV. OPTOELECTRONIC FIBER NANO-ARCHITECTURE

Figure 2A:
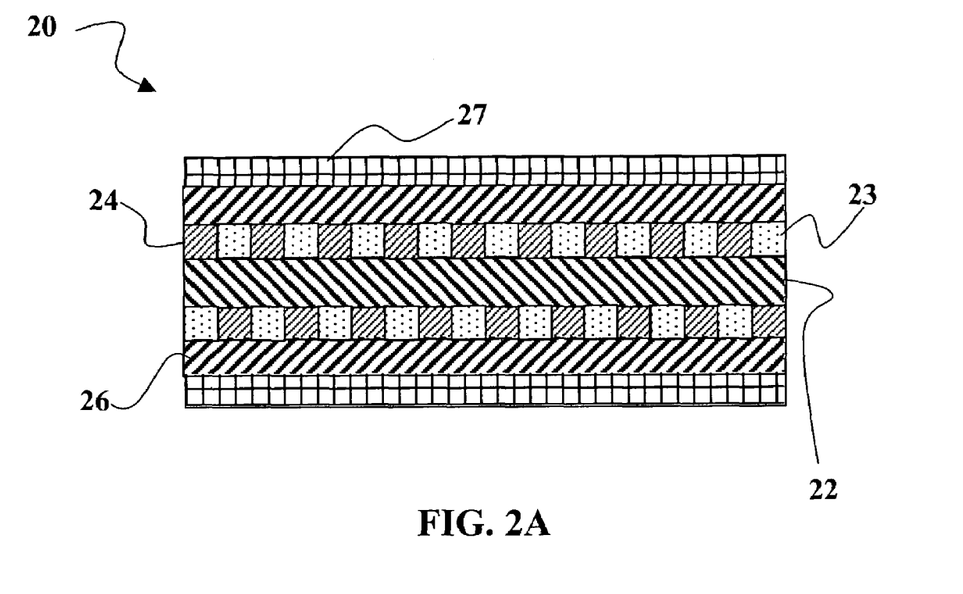
FIGS. 2A-2B respectively depict side and front cross-sectional views of a portion of an optoelectronic fiber according to an embodiment of the present invention.
Figure 2B:
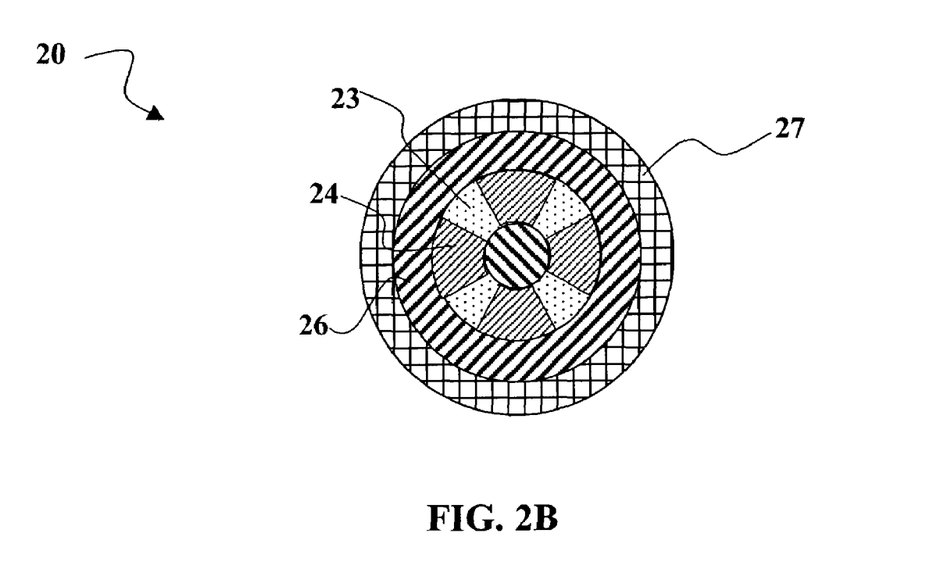

A variation on the optoelectronic fiber of FIG. 1 is depicted in FIGS. 2A-2B. In this particular embodiment, first and second semiconducting layers are formed using nanostructured materials, substantially surround a fiber core. By way of example, the nanostructured material may include a semiconducting mesoporous template and a semiconductor material of a complementary type that fills the pores in the template. Specifically, an optoelectronic fiber 20 may generally include a fiber core 22 and a semiconducting mesoporous template 23 formed on a surface of the fiber core 22. A semiconducting material 24 that is complementary to the material of the mesoporous template 23 may fill the pores in the mesoporous template 23. In one particular embodiment, among others, the mesoporous template 23 and pore-filling material 24 may be chosen so that the fiber 20 may act as an organic solar cell.

The mesoporous template 23 and the pore-filling material 24 may be regarded as semiconducting layers, of complementary types, that substantially surround each other.

An optional conducting layer 26 substantially surrounds the mesoporous template 23 and the pore-filling material 24. If the fiber core is a conducting material, an optional insulating layer may be disposed between the fiber core 22 and the pore filling material 24 to electrically isolate the two. An optional encapsulating layer 27 may cover the mesoporous template 23 and/or pore-filling material 24 and/or conducting layer 26. In certain examples, the fiber 20 may have a diameter of between about 10 nanometers (nm) and about 1 mm, more preferably, between about 50 nm and about 500 nm and most preferably between about 100 nm and about 200 nm. The core 22 may be made from any suitable fiber-making material. The choice of material may depend on the particular application intended for the fiber 20. Examples of such materials include conducting and semiconducting materials such as those materials listed above with respect to the core 12 of the fiber 10 shown in FIGS. 1A-1B. Although, FIG. 2B depicts the core 2 as having a substantially circular cross-section, other cross-sectional shapes, e.g., elliptical, oval, etc. may be used.

The pore-filling material 24 may be deposited in the pores by any suitable technique, including electrodeposition or chemical bath deposition. By way of example, the pore-filling material 24 may be $TiO_2$, Copper Oxide, $ZnO_2$, $ZrO_2$ lanthanum oxide, niobium oxide, tungsten oxide, strontium oxide, calcium/titanium oxide, sodium titanate and potassium niobate, CdSe, CdS, or CdTe or blends of two or more such materials.

As an alternative to the mesoporous template 23 and pore-filling material 24, the nanostructured material may be implemented as an architecture wherein two different materials are regularly arrayed and wherein the presence of two different materials alternates within 1 nm to 100 nm distances. The two materials may be arrayed using nanostructures such as filled pores, nanolamellas, or other matrixed nanostructures. Such an architecture may integrate a conducting or semiconducting polymer into a mesoporous substrate to form a base matrix for a nanostructured layer. The mesoporous template 23 may have a conducting or semiconducting polymer or other media containing pores that are filled with a material having a different electron affinity than the surrounding conducting or semiconducting media to create an interdigitated mesh network amongst the conducting or semiconducting polymer media. Examples of such an architecture are described in commonly assigned U.S. patent application Ser. No. 10/319,406 to Brian M. Sager et al., filed on Dec. 11, 2002 and entitled "NANO-ARCHITECTED/ASSEMBLED SOLAR ELECTRICITY CELL", the entire disclosures of which are incorporated herein by reference.

The mesoporous template 23 may be made from suitable conducting, semiconducting, or insulating material, depending upon the desired application for the fiber 20. Examples of such materials include precursors such as alkoxysilanes and metal alkoxides such as titanium isobutoxide, titanium iso-propoxide, zirconium butoxide, aluminum iso-propoxide and mixtures thereof. Furthermore, organoalkoxysilanes when dissolved in a polar solvent and hydrolyzed under basic, acidic, or neutral conditions are useful as precursor sol materials used to make a mesoporous template 23. The pore-filling material 24 may a suitable conducting or semiconducting material of a complementary type to the material of the mesoporous template 23. Examples of such materials include organic materials, including conjugated polymers such as polythiophene, PPV, MEH-PPV, and inorganic materials such as copper oxide. The pores in the mesoporous template 23 are distributed over the surface of the fiber 22 in a substantially uniform fashion with neighboring pores being between about 1 nm and bout 50 nm apart from each other. In preferred embodiments of the invention the pores are between about 5 nm and about 50 nm apart from each other. In more preferred embodiments of the invention the pores are between about 10 nm and about 20 nm apart from each other. In the most preferred embodiments, the pores are less than one exciton path length apart from each other. Examples of mesoporous templates are described in commonly assigned U.S. patent application Ser. No. 10/290,119, to Brian M. Sager et al., filed Nov. 5, 2002 and entitled "OPTOELECTRONIC DEVICE AND FABRICATION METHODS", the entire disclosures of which are incorporated herein by reference.

For optoelectronic applications of the fiber 20, the mesoporous template 23 and the material 24 filling its pores desirably have different electron affinities. As a result, the fiber 20 may act as an optoelectronic device. Such an optoelectronic device may be a photovoltaic device, e.g., a solar cell, or a light-emitting device, e.g., a light emitting diode or laser. In general the mesoporous template serves as a charge-splitting and charge transporting network. In the case of a photovoltaic device the mesoporous template and/or material absorb radiation in such a way as to produce a voltage and/or current. In the case of a light-emitting device, a voltage applied between the mesoporous template 23 and the filler material 24 causes the emission of radiation. Either way, it is typically desirable that the conducting layer 26 and encapsulant 27 be transparent to whatever radiation is to be emitted or absorbed. In the case of a photovoltaic device, it is additionally desirable that the encapsulant be an electrically conducting material, such as a conducting polymer.

As another alternative to the mesoporous template 23 and pore-filling material 24, the nanostructured material coating the fiber core 22 may be implemented as a nanoscale grid network and a network-filling material that substantially fills spaces in the nanoscale grid network. The network-filling material and nanoscale grid network have complementary charge-transfer properties with respect to each other. Such a nanoscale grid network may have interconnected structures of between about 1 nm and about 100 nm in diameter that are distributed in a substantially uniform fashion with neighboring pores separated by a distance of between about 1 nm and about 100 nm. The structures are interconnected and accessible from an underlying layer and/or overlying layer (if any). The nanoscale grid network may be formed by first forming a porous template, e.g., using surfactant temptation technique. After a pore-filling material is deposited in the pores of the porous template, the template may be removed, leaving behind a nanoscale grid network. Spaces in the grid-network are filled with a network-filling material having complementary charge transfer properties with respect to the material of the nanoscale network grid. Examples of such grid networks are described in U.S. patent application Ser. No. 10/303,665 to Martin R. Roscheisen et al. entitled "MOLDING TECHNIQUE FOR FABRICATION OF OPTOELECTRONIC DEVICES" and filed on Nov. 22, 2002, the entire disclosures of which are incorporated herein by reference.

III. FABRICATION OF OPTOELECTRONIC FIBERS

Optoelectronic fibers of the type depicted in FIGS. 2A-2B may be manufactured in accordance with an inventive method. An example of an embodiment of such a method is illustrated in FIGS. 3 and 4A-4D. The method is best comprehended by referring simultaneously to FIGS. 3, and 4A-4D. As shown in the flow diagram of FIG. 3 an optoelectronic fiber 41 may begin at step 32 by electrospinning an appropriate spinning solution into a filament to form a core 42 shown in FIG. 4A.

Figure 3:
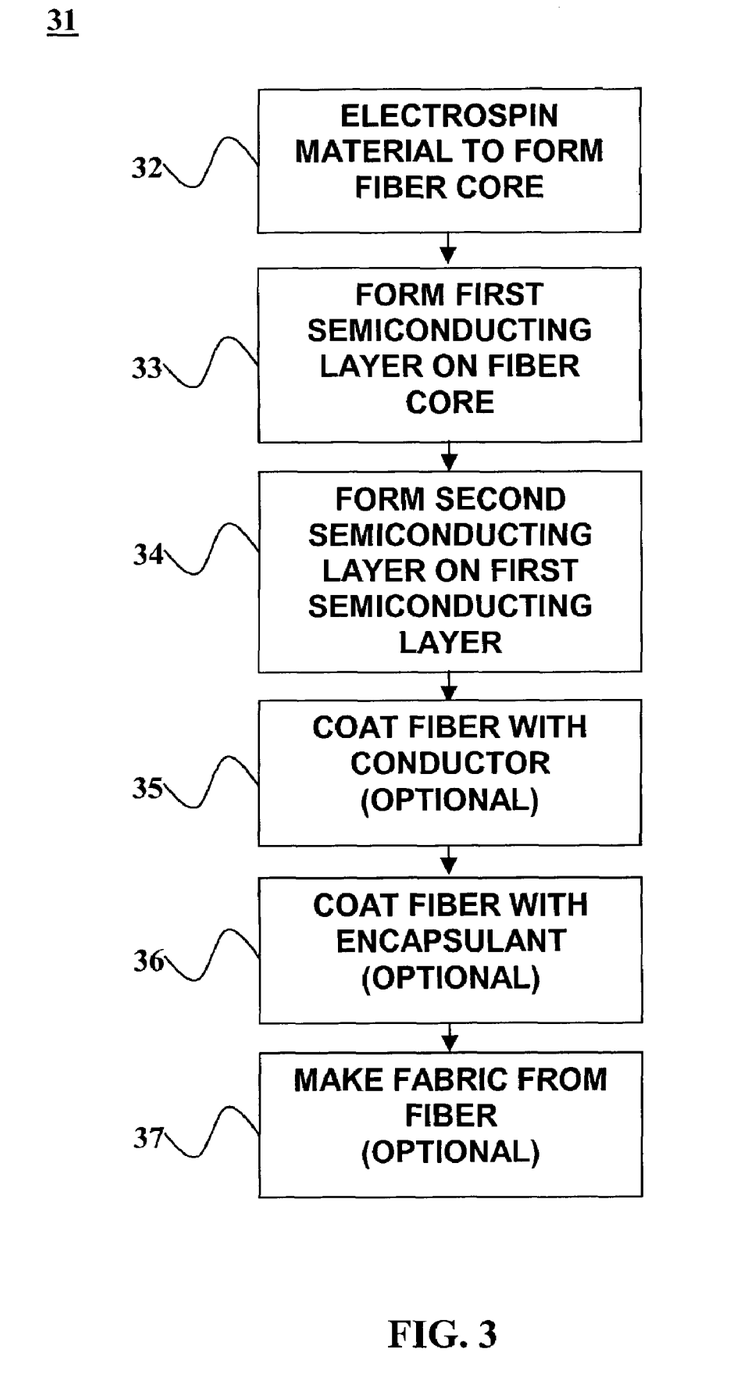
FIG. 3 depicts a flow diagram illustrating a method for making an optoelectronic fiber according to an embodiment of the present invention.
Figure 4A:
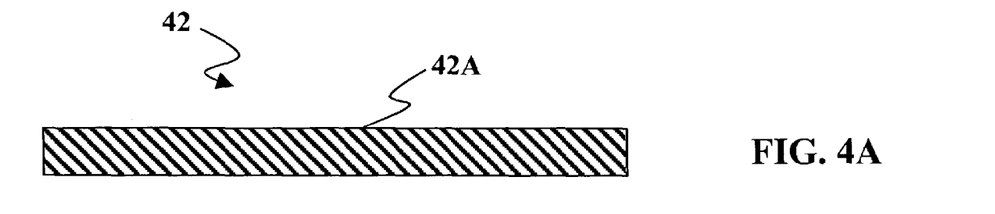
FIGS. 4A-4D depict side cross-sectional views of an optoelectronic fiber in various stages of manufacture according to the method of FIG. 3.
Figure 4B:
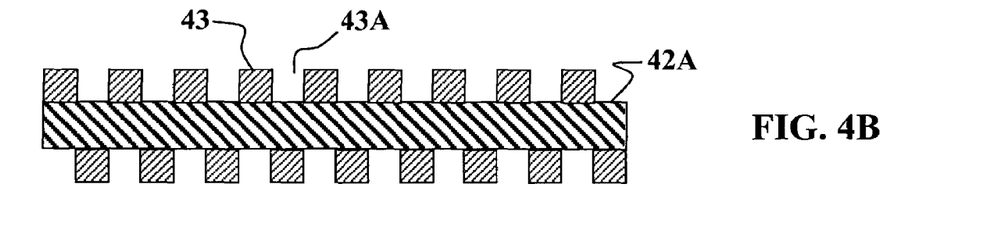

At step 33 a surface 42A of the core 42 may be coated with a first semiconducting layer 43, e.g., a mesoporous template having pores 43A that are distributed over the surface 42A as shown in FIG. 4B. The pores 43A may be filled by any suitable technique, such as dip coating, spray coating, or the like. The mesoporous template may be formed on the surface 42A, e.g., by dip coating, spray coating, web coating and the like. [It is also possible to form the mesoporous template 43 on the fiber surface 42A after the fiber has been woven into a fabric.

Although a mesoporous template is shown as the first semiconducting layer 43 in FIG. 4B, the first semiconducting layer 43 may alternatively be a substantially uniform layer like the first semiconducting layer 14 shown in FIGS. 1A-1B. Furthermore, although the pores 43A are shown as being oriented substantially parallel to each other and substantially perpendicular to an axis of the fiber core 42 the pores 43A may have other configurations. Fore example, the pores may be oriented at an oblique angle with respect to an axis of the fiber. Furthermore, the pores may have convoluted and/or interconnecting shapes. Regardless of the shape and orientation of the pores 43A, it is generally desirable for the pores 43A to provide paths between the surface 42A of the fiber core 42 and whatever lies immediately beyond the pores 43A, e.g., a conducting layer 46.

Figure 4C:
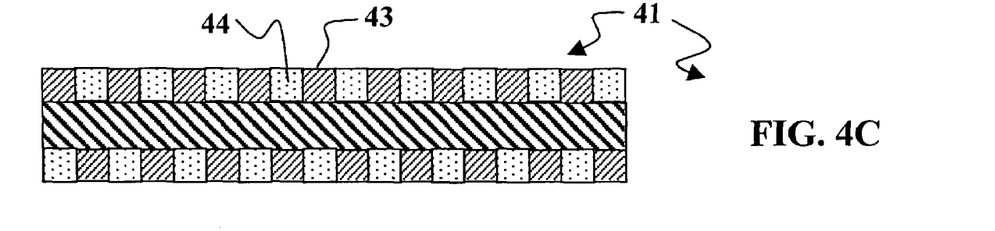

At step 34 a second semiconducting layer 44 is formed that substantially surrounds the first semiconducting layer 43. By way of example, the pores 43A may be filled, as shown in FIG. 4C, with a pore-filling material, e.g., of the type described above with respect to FIGS. 2A-2B. Alternatively, the second semiconducting layer may be in the form of a substantially uniform layer similar to the second semiconducting layer 16 shown in FIGS. 1A-1B.

Figure 4D:
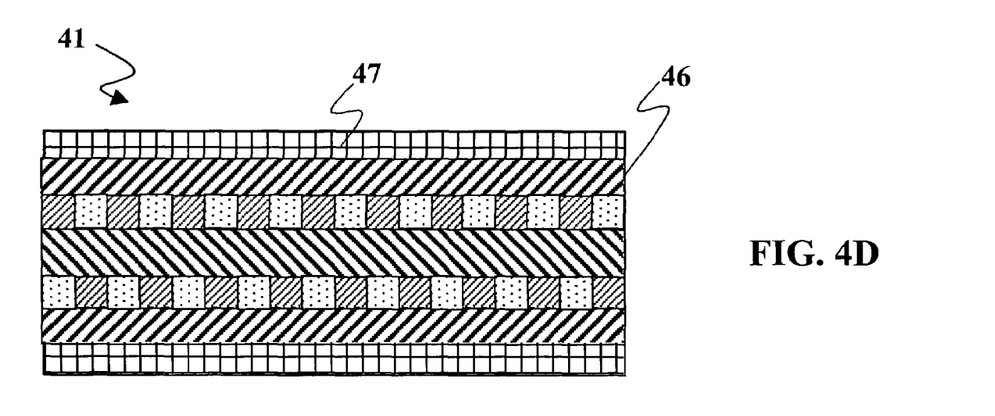

At optional steps 35 and 36, the fiber 41 may be coated respectively with a conducting layer 46 or an encapsulant 47 that covers at least a portion of the mesoporous template 43 and material 44 as shown in FIG. 4D. Any suitable means may be used to coat the fiber 41 with the conducting layer 46 and/or encapsulant 47. Such means include dip coating, spray coating, inkjet printing, web coating, spin coating, etc. At another optional step 37, the fiber 41 may be made into a web or fabric, e.g., by weaving, knitting, or the like.

The order of optional steps 35, 36 and 37 is somewhat dependent on the desired application. In some applications it may be desirable to perform step 37 before steps 35, 36. Furthermore, although the pores 43A are typically filled with the material 44 in the course of fabricating a completed fiber 41, there may be some applications where the pores are not filled until the fiber 41 is actually used as an optoelectronic device. As such, step 37 may sometimes be performed before step 34. One example of such a situation is where the fiber 41 or a fabric or web made from the fiber 41 is used in a radiation-driven electrolytic cell. In such a case, the pores 43A may be filled with water that flows over the fiber, fabric or web so that radiation interacting with the template and water dissociates the water into hydrogen gas and oxygen gas.

Figure 5:
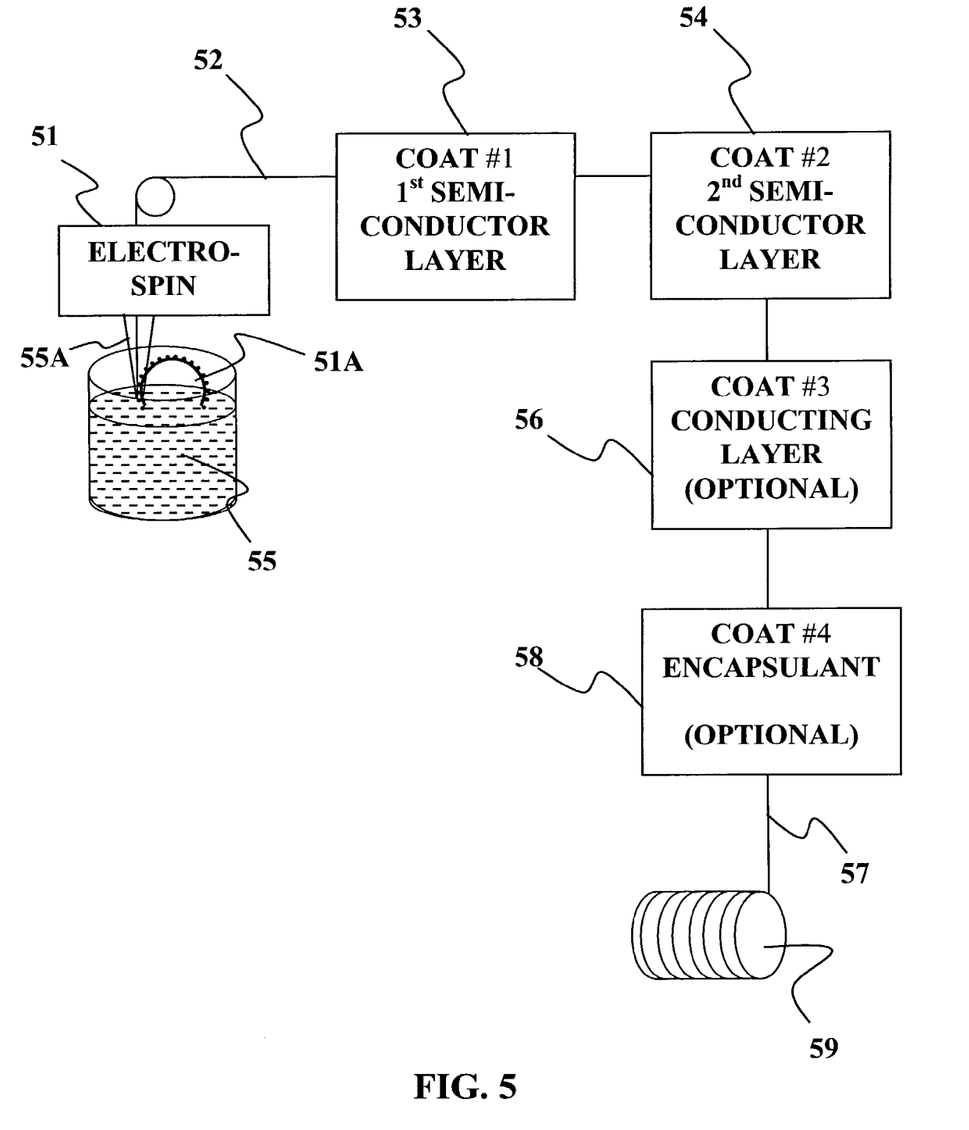
FIG. 5 depicts a schematic diagram of an apparatus for making optoelectronic fibers according to an embodiment of the present invention.

By way of example, and without loss of generality, the method described above may be implemented using an apparatus according to another embodiment of the present invention. FIG. 5 depicts a schematic diagram of an example of such an apparatus 50 having an electrospinning unit 51, and at least two coating units 53, 54 for forming first and second semiconductive layers on a fiber core 52. The apparatus 50 may include additional coating units 56, 58 for forming a conducting layer and/or an encapsulating layer on the fiber. The electrospinning unit 51 forms the fiber core 52 by passing a spinning solution 55 including a liquid fiber-forming conductive material between two electrodes. A voltage applied between the electrodes produces an electric field that draws out the spinning solution 55 into one or more filaments 55A. By way of example, and without limitation, one of the electrodes may be a toothed wheel 51A that dips into the electrospinning solution 55 as it rotates. The electrospinning unit 51 then spins the filaments 55A to form the fiber core 52. The fiber core 52 then passes through the coating units 53, 54, 56, 58 where various layers are formed, e.g., by dip coating, spray coating, electrodeposition, and the like, depending on the nature of the layer being formed. The completed fiber 57 may then be collected by winding the fiber around a spool or drum 59. The completed fiber 57 may be subsequently formed in a fabric or web, e.g., by weaving or knitting, using conventional equipment.

A. Forming the Core Fiber

A number of different techniques may be used to form a fiber core. Examples of such techniques include sol gel techniques, such as monolithic gel processing. This involves fiber formation from monolithic gel performs, e.g., by casting a gel into a cylindrical shape followed by drying, sintering the perform under conditions that reduce the OH concentration to ppb levels, and conventionally drawing a fiber from the preform above the glass softening temperature for the gel. Two other sol gel techniques are drawing fibers directly from viscous sols at room temperature, and unidirectional freezing of gels.

Other suitable techniques include spinning techniques, such techniques include, e.g., electrospinning techniques and dry-wet spinning techniques. For example, electrospinning techniques, originally developed for preparing artificial threads, may be adapted to applications in the fabrication of optoelectronic fibers, fabrics or webs. In electrospinning techniques, a spinning solution, from which threads can be drawn, may be introduced into an electric field either by means of a nozzle or by any other suitable device, which may form one of the electrodes that produce the field. In order to produce the potentials necessary for carrying out the process, all known sources for the production of direct, alternating and multiphase currents are suitable and both of the latter may be of any desired periodicity. Pulsating direct currents, obtained, e.g., from alternating or multiphase currents with the aid of rectifiers, may also be employed. When employing a direct current, the result of the filament production may be modified by reversing the current. The potential difference employed depends upon the properties of the spinning solution and may, by way of example and without limitation, amount to between about 5,000 to about 10,000 volts.

The spinning solution can be treated with any desired admixtures, such as softening agents, etc. which have already been, or may yet be proved to be, advantageous for preparing the solutions for artificial filaments. Spinning solutions which have been brought near the point of coagulation by the addition of precipitated liquids may also be employed.

Although electrospinning is well-known, (see e.g., U.S. Pat. No. 1,975,504 to Formhals, which is incorporated herein by reference) the inventors are not aware of any application of electrospinning techniques to the fabrication of electronic devices, photonic devices, photovoltaic devices such as solar cell devices, or other optoelectronic devices.

Alternatively, dry-wet spinning techniques may be used to form the fiber core. By way of example, an electrically conductive polyaniline fiber may be prepared by dry-wet spinning techniques as follows. Polyaniline in its most useful and environmentally stable oxidation state is given the name emeraldine base (EB) A high molecular weight EB may be synthesized by dissolving aniline in HCL in a ration of 100 g of aniline to 1500 mL of HCl together with enough LiCl to make a 5 M salt solution. This solution may be subsequently cooled to about −45° C., e.g., by immersing the container holding the solution in a cyclohexanone/$CO_2$ ice bath. The cooled salt solution may be mechanically stirred throughout the polymerization process. Ammonium persulphate may then be dissolved in a separate container holding a solution of 1M HCl and 5M LiCl to form an oxidant solution. The ratios of ammonium persulphate HCl and LiCl in the oxidant solution are about 131 g (0.574 mole) to 1200 mL HCl/LiCl solution. The oxidant solution may be added to the aniline solution, e.g., at about 8 mL per minute. The reaction may be maintained at about −45° C. for about 48 hours. Emeraldine hydrochloride powder may be collected and subsequently washed with 1M HCl until the filtrate becomes colorless. The polymer may then be washed with water and transferred to a container holding a solution of 0.1 N $NH_4OH$, (e.g., about 2.5 L) stirred for 1 hour and subsequently vacuum filtered to collect the deprotonated emeraldine base powder. The powder may then be further reacted with another 0.1 N $H_4OH$, aqueous solution (e.g., about 2.5 L) for another hour and subsequently vacuum filtered to recover the EB powder. The polymer may then be dried under dynamic vacuum at $10^{-2}$ torr for about 72 hours.

A solution for spinning EB solid fibers may be prepared from the powdered EB as follows: a gel inhibitor (GI) may be prepared by mixing 31.32 g of N-methyl-2-pyrrolidinone (NMP) with 4.879 g ($7.9 \times 10^{-2}$ mole) of 2-methylaziridine [90%, 2-MA, Aldrich]. This mixture may be placed in a 60 ml glass jar with a Teflon lined screw cap at 60° C. for about 1 h., after which 9.109 g ($2.5 \times 10^{-2}$ mole) of EB may be quickly added to this NMP/2-MA mixture (GI/EB=3.1), and vigorously stirred for a few minutes to wet the polymer powder. The glass jar may be tightly sealed and returned to the oven set at 100° C. for about 30 min. During this time, the EB/NMP/2-MA mixture may be removed about every 10 min. and vigorously stirred. After this time, a flowable homogeneous liquid solution free from gel particles formed. The concentration of EB in this solvent system may be about 20 wt %. The EB solution may then be transferred to a hydraulic stainless steel cylinder and cooled to room temperature. A gear pump motor, fed by a nitrogen gas at 100 psi, may be used to drive the EB fluid through ⅜ in stainless steel tubing, and through a spinnerette (e.g., 500 mm O.D.), at a pressure of 250 to 1,000 psi. The polymer solution may be extruded through a 1 in. air-gap directly into a water coagulation bath (0° C.) where the solvent and GI may be removed from the nascent polyaniline fiber by de-mixing and solvent/nonsolvent exchange in the bath. The take-up speed may be varied between 3 to 10 feet per min. The nascent fiber may be continuously wound on a series of two water bath godets maintained at 15° C., and collected on a bobbin by means of a Leesona Winder. The fibers may be placed in water extraction baths for 48 h. to remove residual solvent and dried under dynamic vacuum.

Stretch alignment of the fibers may increase their conductivity. The conductivity of a stretch aligned fiber is generally 1 to 2 orders of magnitude greater than that for an unstretched fiber. The fibers may be stretch aligned by stretching the fiber across a heat source, at e.g., about 120° C., while the fiber is under tension. As the heat softens the fiber a draw stretch ratio of 3 to 5 times may be obtained. This mechanical stretching may reduced the fiber diameter, e.g., from about 450 μm to about 100 μm. The maximum draw ratio depends on the amount of residual plasticizing solvent and the temperature of the heat source. Overdrying the fiber may reduce the drawing ratio. Stretched or unstretched fibers may also be doped e.g., by immersion in an aqueous acid solution for 48 hours removed from the doping solution, dried under dynamic vacuum for another 48 h. Examples of suitable doping solutions include 1.5 N HCl, 1N acetic acid, and aqueous solutions of benzenephosphonic acid (BPA) (pH=−0.37). Formation of polyaniline fibers is described further in U.S. Pat. No. 6,099,907 to Mattes et al., which is incorporated herein by reference.

C. Coating the Fiber Surface with Semiconducting Layers

The semiconducting layers that surround the fiber core may be formed by a number of standard coating techniques. Such techniques include web coating, dip coating, spray coating, and inkjet-like deposition. Application of such techniques is fairly straightforward where the semiconducting layers are applied as substantially uniform layers of the type shown in FIGS. 1A-1B. Generally, a liquid solution containing layer-forming materials is deposited on the fiber core as the core passes through a coating unit. The layer-forming materials then react to form the appropriate layer. Such a reaction may be a chemical reaction between two or more components of the layer-forming solution or may be a physical reaction such as evaporation of a solvent from the layer-forming solution, and/or curing by heating or exposure to ultraviolet (UV) radiation, or some combination of both.

There are several approaches to forming layers containing nanostructured materials, such as mesoporous templates, on a fiber core. One such approach, among others, involves templated growth of inorganic or hybrid networks, e.g., by surfactant temptation. Examples of surfactant-templation techniques for producing porous films are described, e.g., by Brinker, et al in U.S. Pat. No. 6,270,846, the disclosures of which are incorporated herein by reference. One particular surfactant-templation approach, among others, utilizes evaporation-induced self-assembly (EISA) to form a meso-organized liquid-crystal template. This process has been well developed for the fabrication of porous silica, where the substrate is first coated with siloxane and surfactants in an ethanol solution. As the ethanol evaporates over a short time (typically 60-120 seconds), the molecules within the siloxane-surfactant micelle rearrange themselves to minimize their collective energy level. This process continues as the molecules further rearrange their nanoscale organization into highly regular liquid-crystalline mesophases.

The resulting porous films contain a high and tunable density of regular, interconnected pores spaced in repeating patterns, with pores neighboring pores spaced approximately 5 nm apart and with pore diameters of about 5 nm, dependant on the choice of surfactant.

This nanoscale architecture is highly reproducible, and can be permanently fixed by heating. The resulting nanofilm is extremely stable and mechanically robust. Pore diameter and pore spacing may be adjusted by (1) choice of surfactant, (2) concentration of surfactant, (3) the use of block co-polymers, (4) temperature, (5) humidity level, (6) deposition procedure and speed, (7) concentration of siloxane, (8) use of a cosolvent, (9) use of swelling agents or some combination of two or more of (1), (2), (3), (4), (5), (6), (7), (8) and (9). Thus, by suitable choice of the layer-forming material and reaction conditions, a liquid material can be used to form highly porous thin films by such standard methods as dip-coating, spray-coating, web coating or spin-coating.

In one embodiment, among others, the mesoporous template may be fabricated using a precursor sol. To synthesize the sol, mixtures of one or more alkoxides, one or more surfactants one or more condensation inhibitors, water, and ethanol are combined.

Examples of suitable alkoxides include polysiloxanes such as tetraethylorthosilicate (TEOS). Examples of suitable surfactants include $HO(CH_2CH_2O)_n(CH_2CHCH_3O)_m(CH_2CH_2O)_nH$, where the subscripts m and n are integers. In one embodiment, among others, the surfactant is a molecule wherein n is 20 and m is 70. A particular surfactant of this type is the block copolymer poly(ethyleneoxide)-b-poly(propyleneoxide)-b-poly(ethyleneoxide) (EO20-PO70EO20), sometimes known commercially as Pluronic P123. For Pluronic P123, n=20, m=70, n=20 and the nominal molecular weight is 5750 g/mol. Other suitable surfactants include hexadecyl trimethylammonium bromide (CTAB), polyoxyalkylene ether (e.g. Pluronic F127), and poly(oxyethylene) cetyl ether (e.g., Brij56 or Brij58) Pluronic is a registered trademark of BASF Corporation of Ludwigshafen, Germany. Brij is a registered trademark of Atlas Chemicals of Wilmington Del.

For Pluronic F127, which is a triblock copolymer (PEO-PPO-PEO, having an n-m-n ratio of EO97PO69EO97, i.e., n=97, m=69, n=97. The nominal molecular weight for Pluronic F127 is 12,600 g/mol. F127 is a difunctional block copolymer surfactant terminating in primary hydroxyl groups. It is a nonionic surfactant.

Brij 56 is polyoxyethylene 10 cetyl ether. Brij 58 has several synonyms, including poly(oxyethylene) cetyl ether, poly (oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), etc., bases such as sodium hydroxide (NaOH), triethylamine, etc., and chelating agents, including acetyl acetone, alcohol amines, peroxides, etc.

Generally speaking, the molar ratios of the surfactant, condensation inhibitor, ethanol and water may be in the following ranges with respect to X, where X refers to the central element or inorganic network atom, e.g., Ti, Zr, Zn, Si, etc. in the alkoxide:

[Surfactant]/[X]: a molar ratio ranging from about $1 \times 10^{-7}$ to about 0.1

[Ethanol]/[X]: a molar ratio ranging from about 3 to about 20

[Condensation Inhibitor]/[X]: a molar ranging ratio from about $1 \times 10^{-5}$ to about 5

[water]/[X]: a molar ratio ranging from about 1 to about 2.

By way of example, a precursor sol for a porous template of $SiO_2$ may be prepared from TEOS, a polar organic solvent, water and an acid, a hydrophobic compound such as polypropylene oxide (molecular weight of approximately 2000) and a surfactant, such as a polyoxyethylene ether or P123. The polar organic solvent can be any solvent that solubilizes the other reactants, particularly such solvents as alcohols, and more particularly, methanol, ethanol, propanol, butanol, tetrahydrofuran, and formamide or mixtures thereof. An initial silica sol may be prepared by refluxing TEOS, ethanol, water and an acid, such as HCl, at approximately 60° C. By way of example, the molar ratio of the TEOS, ethanol and acid may be about $1:3.8:1.5 \times 10^{-5}$. The sol may be cooled to room temperature and surfactant, $CH_3(CH_2)_{15}(OCH_2CH_2)_{10}OH$, in amounts ranging from 0.6 g to 1.0 g, and the polymer, polypropylene oxide (PPO), in amounts ranging from approximately 0 g to 1.2 g, may be added to 5 mL of the sol, along with 0.8 mL of 1N HCl. The sols may be filtered and a thin film prepared from this solution by spin-coating, web-coating, dip-coating, spray-coating, ink-jet printing, etc. onto the surface of a fiber core. During the coating procedure, evaporation of the solvent causes the formation of surfactant-stabilized polypropylene microemulsions incorporated into a surfactant-templated silica material. The as-coated films must be crosslinked to form a mesoporous grid and may be heated to approximately 400° C. to 450° C. for approximately 3 hours to remove surfactant and polypropylene oxide templates. Incubation temperature, ramp rate and total incubation time may be varied to optimize the properties of the film.

After incubation of the sol mixture, a substrate, e.g., the fiber core, may be dipped in the mixture and removed e.g., using an automated, custom-built dip coating apparatus or a commercially available web coating system. Upon removal from the sol, preferential ethanol evaporation concentrates the sol in water, non-volatile surfactant, and the TEOS component thereby forming a $SiO_2$ surfactant-templated porous film. The progressive increase in surfactant concentration drives the self-assembly of metal-alkoxide-surfactant micelles and their further organization into liquid-crystalline mesophases.

The highly-ordered structure of the resulting liquid crystallites can be permanently fixed through exposure to heat. After pattern deposition and drying, the surfactant templates can be selectively removed by annealing the surfactant templated porous film at a temperature (e.g., about 170° C. to about 400° C.) that is sufficient to covalently crosslink the mesoporous matrix and/or is sufficient to decompose the surfactant molecules while remaining within the thermal stability range of the underlying fiber core. The annealing time depends, partly, on the annealing temperature. In general, the high the temperature, the shorter the time and vice versa. An annealing temperature of about 250° C. or higher is preferable as this temperature serves both to covalently cross-link the matrix and to pyrolyze the surfactant out of the matrix within a relatively short time. Once the sol has been cross-linked to itself and the substrate, any remaining surfactant may be removed by heating at more than about 350° C. or by soaking the substrate in ethanol or another appropriate solvent. Alternatively, the film may be annealed for a shorter time at a higher temperature or for a longer time at a lower temperature. Furthermore, either as an alternative to annealing, or in conjunction with annealing, the surfactant template may be exposed to energetic radiation, such as ultraviolet (UV) radiation, to facilitate crosslinking of the grid to form a mesoporous grid and to destroy the structure of the surfactant and make it easier to wash out.

The annealing preferably occurs before the deposition of any semiconducting material, e.g. electron-accepting material such as $TiO_2$, CdSe, CdS, CdTe, etc., into the porous template film, as it is this initial step that creates the porous structure. Thus any semiconducting material to be deposited in a later step will not be affected by the annealing of the porous film in this prior step.

Porous silica does not have the appropriate electron-accepting properties required for the charge-splitting network layer in an optoelectronic device such as a solar cell. However, the pores may be filled with a semiconducting material and the silica may be removed, e.g., by a suitable etchant, leaving behind a nanoscale grid network. The spaces in the nanoscale grid network that were formerly occupied by the silica may be filled with a network-filling material having a different electron affinity from the material of the nanoscale grid network.

Alternatively, a similar sol-gel based synthetic approach of the type described above may be used to produce, e.g., porous Titania or other metal oxide films. With a band gap of 3.2 eV, Titania ($TiO_2$) absorbs light from the near-ultraviolet region of the spectrum, and the material has relatively high charge mobility. Thus Titania does have the proper electronic properties for effective charge-splitting. Furthermore, Titania is widely available and relatively inexpensive.

In one example, among others, a porous film of Titania may be formed on a fiber core using a sol mixture containing titanium ethoxide (an alkoxide), Pluronic P123 as a surfactant (available from BASF of Ludwigshafen, Germany), HCl as a condensation inhibitor, water and ethanol Alternatively, titanium tetraisopropoxide may be used as the alkoxide. The initial sol mixture may be prepared by refluxing titanium ethoxide, ethanol, water and an acid, such as HCl, at approximately 60° C.

The molar ratios of the P123 surfactant, HCl, ethanol and water may be in the following ranges with respect to titanium in the alkoxide:

[P123]/[Ti] a molar ratio ranging from about $1 \times 10^{-7}$ to about $1 \times 10^{-5}$

[Ethanol]/[Ti] a molar ratio ranging from about 10 to about 2

[HCl]/[Ti] a molar ratio ranging from about 0.5 to about 5

[$H_2O$]/[Ti] a molar ratio ranging from about 1 to about 10

The sol may be cooled to room temperature and the surfactant p123 may be added in amounts ranging from 0.6 g to 1.2 g. The polymer, polypropylene oxide (PPO), may also be added in amounts ranging from approximately 0 g to 1.2 g, to 5 mL of the sol, along with 0.8 mL of 1N HCl. The sol may be filtered and a thin film may be prepared from the sol, e.g., by dip-coating the sol onto a fiber core. Prior to dip-coating, the fiber core may be cleaned, e.g., by sequential washing in (i) acetone, then (ii) methanol, then (iii) isopropyl alcohol (IPA).

During the coating procedure, evaporation of the solvent causes the formation of surfactant-stabilized polypropylene microemulsions incorporated into a surfactant-templated Titania material. The as-coated films may be heated to approximately 400 to 450° C. for approximately 3 hours to remove the surfactant and polypropylene oxide templates. During part of this phase, the temperature may be ramped up at between about 0.5 C.°/min and about 5 C.°/min from room temperature up to about 400° C. Surfactant-templated film prepared by this technique can have pores about 9 nm to 13 nm in diameter, with the pores spaced about 10 nm to 17 nm apart.

D. Forming Layers and Filling the Pores in the Mesoporous Template

Whether a mesoporous template is used or not, one or more of the semiconducting layers or other layers used in an optoelectronic fiber may be deposited by electrodeposition. Examples of electrodeposition techniques are described for example in "Electrodeposition of PbS, PbSe and PbTe thin films" by Heini Saloniemi, VTT Publications 423, Dec. 15, 2000, an electronic copy of which may be accessed at http://www.inf.vtt.fi/pdf/publications/2000/P423.pdf and which is incorporated herein by reference. Additional information may be found in "Hot Topics in Electrodeposition" by Andrew A. Gewirth, Panos C. Andricacos, and Jay A. Switzer, with John O. Dukovic, editor, The Electrochemical Society Interface, Spring 1998, an electronic copy of which may be accessed at http://www.electrochem.org/publications/interface/spring98/IF3-98-Pages22-25.pdf and which is incorporated herein by reference.

Alternatively, the pores in a mesoporous template may be filled with a melted polymer material by capillary action. For example, a polymer material, e.g., a conjugated polymer may be applied to the mesoporous template in a non-melted state. The polymer material and template may then be heated at about 200° C. for about 2 minutes. Capillary action attracts the melted polymer in to the pores in the mesoporous template.

IV. ALTERNATIVE EMBODIMENTS

The methods and apparatus within the scope of the present invention may be employed to optimize various result-effective parameters for optoelectronic fibers, including efficiency, stability and cost. For photovoltaic nanofibers of the type described above result-effective parameters include the type and composition of material used in as the semiconducting layers. Such materials may include metals, e.g., CdSe, $CuInSe_2$, CdTe, C60, conjugated and/or other dyes or photosensitizers, polar dyes, perylene and/or other small molecules, etc. Where the semiconducting layers include nanostructures, the morphology, e.g., size, aspect ratio, etc. of the nanostructures in the photoelectric layer is another result-effective parameter. Other result-effective parameters involving the nanostructured and pore-filling materials include cell morphology, architecture (e.g., packing, crystal structure), the presence and composition of photosensitizers, (e.g., Ru—polypyridyl complexes), the presence and concentration of one or more dopants such as Iodine, Lithium, PAN-AMPSA. Properties of the fiber core such as thickness, size, cross-sectional shape and electrical conductivity may also be result-effective parameters. With regard to the encapsulating layers and/or fiber core, the presence and composition of coatings such as conjugated polymers may be result-effective parameters. In addition, the composition and processing of organic materials used in one or more of the layers of optoelectronic fibers (e.g., polymers such as P3HT, Polypyrrole, PolyAniline, Pedot) may be result-effective parameters that can be optimized using the techniques described herein.

Figure 6:
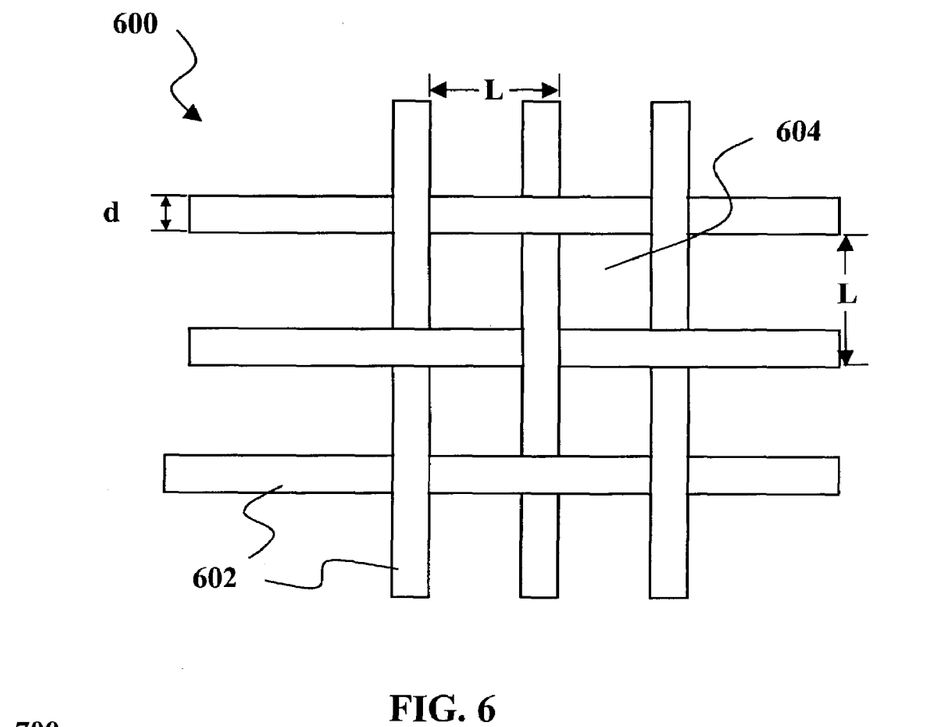
FIG. 6 depicts a diagram of a portion of a web according to an embodiment of the present invention.

In another embodiment, optoelectronic fibers may be fashioned into a matrix or grid-like structure for use as an electrically conductive partially transparent "nanoweb". FIG. 6 depicts a diagram of a portion of such a web 600 fabricated from optoelectronic fibers 602. The fibers 602 may be made from electrically conductive material such as metals or conductive polymers. Alternatively, the fibers 602 may be of any of the types described and depicted above, i.e., with a fiber core surrounded by first and second semiconducting layers. The fibers 602 are generally characterized by a diameter d, and are spaced apart to define one or more openings 604 having a characteristic dimension L. As shown in the example of FIG. 6, the characteristic dimension L may be a spacing between adjacent fibers 602. The number of threads per unit length in the web 600, sometimes referred to as the thread count, may be calculated as 1/L. In the example depicted in FIG. 6, the spacing L between vertical fibers is the same as that for horizontal fibers although the spacings may be different if desired. Furthermore, although a substantially rectangular web pattern is depicted in FIG. 6, other patterns with openings having differently defined characteristic dimensions may be used. The fibers 602 may be woven, knitted or otherwise fashioned into a fabric having useful properties using conventional fabric forming equipment. In the example depicted in FIG. 6, the fibers 602 are as being fashioned in a "woven" pattern, wherein fibers running in one direction alternately pass over and under fibers running in a substantially perpendicular direction. Other configurations of the fibers 602 may be used when fashioning the web 600.

The fibers 602 may include an electrically conductive core, e.g., made from a conjugated polymer or other conducting material, without the surrounding semiconducting layers. In such a case, the fibers 602 may have diameters d between about 10 nm and about 1000 nm. The fiber spacing L may range between about 100 nm and about 500 nm. A web 600 made from such conducting fibers can serve as a flexible transparent conducting material. Where the fiber spacing L is roughly the same as or substantially larger than the wavelength of radiation incident upon it, the transparency of the resulting web 600 depends on the ratio of open area between the fibers 602 to the area $L^2$, which includes the area covered by the fibers 602. The open area can be determined by subtracting the area covered by the fibers 602 (approximately 2 dL in this example) from the total area $L^2$. The open area ratio depends on the both the fiber spacing L and the fiber diameter d. For the example depicted in FIG. 6, the open area ratio may be given approximately by:

OPEN AREA RATIO=[1-2 d/L]

Thus, for fibers of a given diameter d, a desired open area ratio may be obtained by fashioning a web 600 with an appropriate thread count (1/L) For use as a conductive sheet, the open area ratio may typically range between about 0.85 and about 0.90. The value of L can affect the range of wavelengths of the radiation to which the web 600 is to be transparent. In general the web 600 will be substantially transparent to radiation characterized by wavelengths less than or equal to about L and partially transparent to radiation characterized by wavelengths less than about L. Thus, for example, if the web 600 were to be at least partially transparent to wavelengths less than about 1000 nm, L would be about 1000 nm, corresponding to a thread count of about 1000 fibers per millimeter. If an open area ratio of between about 0.85 and 0.9 is desired for the web 600 in this example, the fibers 602 can have a diameter d between about 50 nm and about 75 nm.

Unusual photonic effects can occur for thread spacings L that are substantially less than the wavelength of radiation incident upon the web 600. In particular, for conductive fibers 602, it is possible that photonic interactions between the web 600 and radiation incident on one side of the web may lead to emission of radiation on the opposite side of the web. As a result, a ratio of radiant intensity emerging from a non-illuminated side of the web to radiant intensity incident on an illuminated side could be greater than the open area ratio.

Figure 7:
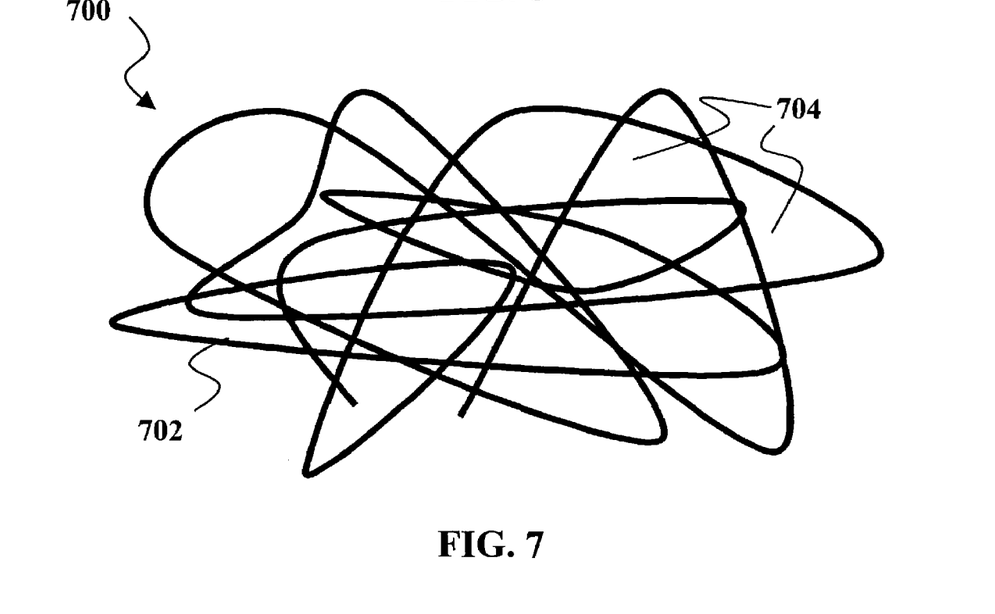
FIG. 7 depicts a diagram of a portion of a web according to another embodiment of the present invention.

An optoelectronic web or fabric may alternatively be fashioned with randomly sized and/or randomly shaped openings. For example, FIG. 7 depicts a portion of a web 700 with randomly sized and shaped openings 704 may be fashioned from one or more strands of electrically conducting or optoelectronic fiber 702, such as conducting fiber or multi-layer fiber of the types described above. The fiber 702 may be placed on a substrate or roller in a random pattern and subjected to pressure, and possibly heat, to compress it into a 2-dimensional or 3-dimensional web 700. This is a fairly simple process well suited to forming a web 700 from fibers 702 that are between about 10 nm to about 1000 nm in diameter. The spacings 704 may have characteristic dimensions of between about 100 nm and about 500 nm. Examples of characteristic dimensions for randomly sized and/or shaped openings include a maximum or minimum diameter across an opening 704 or some average diameter for one or more openings 704 in the web 700. Interesting photonic effects of the type described above may occur if the characteristic dimension of the spacings 704 is less than a wavelength of radiation incident on the web 700.

VI. CONCLUSION

Embodiments of the present invention provide a novel and useful materials for use in optoelectronic and photovoltaic devices as well as methods and apparatus for the manufacture of such materials. It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. An elongate optoelectronic device, comprising:
   an elongate core;
   at least a first semiconducting layer substantially surrounding the elongate core wherein the first semiconducting layer comprises of group IB-IIIA-VIA based material, wherein the group IB material comprises copper, wherein the first semiconducting layer includes a plurality of openings extending through the first semiconducting layer to the elongate core;
   at least a second semiconducting layer substantially surrounding the first semiconducting layer, wherein the material of the first semiconducting layer and the material of the second semiconducting layers are of complementary types; and
   a light transmitting electrically conductive layer that substantially surrounds the second semiconducting layer.

2. The elongate optoelectronic device of claim 1 wherein the elongate core is electrically conductive.

3. The elongate optoelectronic device of claim 1 wherein the elongate core has a diameter of between about 10 nm and about 5 mm.

4. The elongate optoelectronic device of claim 3, wherein the elongate core has a diameter of between about 10 nm and about 400 nm.

5. The elongate optoelectronic device of claim 3, wherein the elongate core has a diameter of between about 400 nm and about 5 mm.

6. The elongate optoelectronic device of claim 1, wherein the first semiconducting layer has a thickness of between about 1 nm and about 50 nm.

7. The elongate optoelectronic device of claim 6, wherein the first semiconducting layer has a thickness of between about 5 nm and about 50 nm.

8. The elongate optoelectronic device of claim 7, wherein the first semiconducting layer has a thickness of between about 10 nm and about 20 nm.

9. The elongate optoelectronic device of claim 1 further comprising an insulating layer substantially surrounding the elongate core.

10. The elongate optoelectronic device of claim 1 wherein the elongate core has a cross-section with a shape selected from one of the following: circular, elliptical, or oval.

11. The elongate optoelectronic device of claim 1 wherein the first semiconducting layer comprises $CuInSe_2$.

12. The elongate optoelectronic device of claim 1 further comprising an encapsulant layer surrounding the light transmitting electrically conductive layer.

13. The elongate optoelectronic device of claim 1 further comprising a light transmitting encapsulant layer surrounding the light transmitting electrically conductive layer.

14. The elongate optoelectronic device of claim 1 wherein the light transmitting electrically conductive layer comprises a light transmitting conductive and encapsulant layer.

15. The elongate optoelectronic device of claim 1 wherein the light transmitting electrically conductive layer comprises a light transmitting conductive and encapsulant layer comprised of a light transmitting conductive polymer.

16. The elongate optoelectronic device of claim 1 wherein the first semiconducting layer substantially surrounding the elongate core has a substantially uniform thickness.

17. The elongate optoelectronic device of claim 1 wherein the second semiconducting layer substantially surrounding the first semiconducting layer has a substantially uniform thickness.

18. The elongate optoelectronic device of claim 1 comprises an elongate solar cell.

19. The elongate optoelectronic device of claim 1 comprising an insulating layer disposed over the fiber core.

20. The elongate optoelectronic device of claim 1 wherein the openings are oriented substantially parallel to each other and substantially perpendicular to an axis of the elongate core.

21. The elongate optoelectronic device of claim 1 wherein the openings are oriented at an oblique angle with respect to an axis of the elongate core.

22. The elongate optoelectronic device of claim 1 the openings provide paths between a surface of the elongate core and a conducting layer immediately adjacent the openings.

23. The elongate optoelectronic device of claim 1 wherein the light transmitting electrically conductive layer and an encapsulating layer are formed by a single layer of material.

24. The elongate optoelectronic device of claim 23 wherein the single layer of material comprises a transparent conducting polymer.

25. The elongate optoelectronic device of claim 24 wherein the openings extend from the core to the single layer of material.

26. The elongate optoelectronic device of claim 1 wherein the openings are distributed in a substantially uniform manner.

27. An elongate photovoltaic device, comprising:
an elongate core;
at least a first semiconducting layer substantially surrounding the elongate core wherein the first semiconducting layer comprises a group IB-IIIA-VIA based material, wherein the group IB material comprises copper, wherein the first semiconducting layer includes a plurality of openings extending through the first semiconducting layer to the elongate core; and
a light transmitting electrically conductive layer that substantially surrounds the first semiconducting layer;
a second material filling the openings and coupling the light transmitting electrically conductive layer to the elongate core.

28. The elongate optoelectronic device of claim 27 wherein the elongate core is electrically conductive.

29. The elongate optoelectronic device of claim 27 wherein the elongate core has a diameter of between about 10 nm and about 5 mm.

30. The elongate optoelectronic device of claim 29, wherein the elongate core has a diameter of between about 10 nm and about 400 nm.

31. The elongate optoelectronic device of claim 27, wherein the elongate core has a diameter of between about 400 nm and about 5 mm.

32. The elongate optoelectronic device of claim 27, wherein the first semiconducting layer has a thickness of between about 1 nm and about 50 nm.

33. The elongate optoelectronic device of claim 32, wherein the first semiconducting layer has a thickness of between about 5 nm and about 50 nm.

34. The elongate optoelectronic device of claim 33, wherein the first semiconducting layer has a thickness of between about 10 nm and about 20 nm.

35. The elongate optoelectronic device of claim 27 further comprising an insulating layer substantially surrounding the elongate core.

36. The elongate optoelectronic device of claim 27 wherein the elongate core has a cross-section with a shape selected from one of the following: circular, elliptical, or oval.

37. The elongate optoelectronic device of claim 27 wherein the first semiconducting layer comprises $CuInSe_2$.

38. The elongate optoelectronic device of claim 27 further comprising an encapsulant layer surrounding the light transmitting electrically conductive layer.

39. The elongate optoelectronic device of claim 27 further comprising a light transmitting encapsulant layer surrounding the light transmitting electrically conductive layer.

40. The elongate optoelectronic device of claim 27 wherein the light transmitting electrically conductive layer comprises a light transmitting conductive and encapsulant layer.

41. The elongate optoelectronic device of claim 27 wherein the light transmitting electrically conductive layer comprises a light transmitting conductive and encapsulant layer comprised of a light transmitting conductive polymer.

42. The elongate optoelectronic device of claim 27 wherein the first semiconducting layer substantially surrounding the elongate core has a substantially uniform thickness.

43. The elongate optoelectronic device of claim 27 comprises an elongate solar cell.

44. The elongate optoelectronic device of claim 27 comprising an insulating layer disposed over the fiber core.

45. The elongate optoelectronic device of claim 27 wherein the openings are oriented substantially parallel to each other and substantially perpendicular to an axis of the elongate core.

46. The elongate optoelectronic device of claim 27 wherein the openings are oriented at an oblique angle with respect to an axis of the elongate core.

47. The elongate optoelectronic device of claim 27 the openings provide paths between a surface of the elongate core and a conducting layer immediately adjacent the openings.

48. The elongate optoelectronic device of claim 27 wherein the light transmitting electrically conductive layer and an encapsulating layer are formed by a single layer of material.

49. The elongate optoelectronic device of claim 48 wherein the single layer of material comprises a transparent conducting polymer.

50. The elongate optoelectronic device of claim 49 wherein the openings extend from the core to the single layer of material.

51. The elongate optoelectronic device of claim 27 wherein the openings are distributed in a substantially uniform manner.

* * * * *